March 29, 1960 R. E. RAWLINS ET AL 2,930,992

WIDE BAND R-C OSCILLATOR

Filed June 25, 1958

ROBERT E. RAWLINS &
ROBERT A. ANDERSEN
INVENTOR.

BY [signature]

ATTORNEYS

United States Patent Office 2,930,992

Patented Mar. 29, 1960

2,930,992

WIDE BAND R-C OSCILLATOR

Robert E. Rawlins and Robert A. Andersen, Palo Alto, Calif., assignors to Dynac Incorporated, Palo Alto, Calif., a corporation of California Application June 25, 1958, Serial No. 744,466

4 Claims. (Cl. 331—141)

This invention relates generally to oscillators and more particularly to wide band R-C oscillators including negative feedback.

R-C oscillators of the single ended and balanced type are well known in the prior art. Generally, in such oscillators a positive feedback path includes the frequency determining elements, and a negative feedback path includes a non-linear resistive element which automatically adjusts its resistance to compensate for variations in output amplitude. The result is an oscillator which has flat frequency response and low distortion over the entire frequency range.

One of the factors which determines the lowest frequency at which an oscillator of the above character can be operated is the thermal time constant of the non-linear resistive element. As the oscillator is tuned to lower and lower frequency, a point is eventually reached where the element follows the individual variations of the output frequency. In a balanced circuit, where there is no D.-C. current passed through the non-linear resistance element, the oscillator can be operated at substantially lower frequencies than in the unbalanced circuit.

When an oscillator of the above character is designed to operate at relatively low frequencies, the time constant of the non-linear element is relatively long. As a consequence, the transient response of the oscillator is poor.

It is a general object of the present invention to provide an improved wide band oscillator of the above character.

It is another object of the present invention to provide a wide band oscillator which includes two negative feedback paths having different transient responses and which includes means for selectively connecting said paths in the circuit.

It is another object of the present invention to provide an oscillator which includes two negative feedback paths having different transient responses and in which photoconductive means are operated in response to tuning of the oscillator to gradually transfer control from one negative resistance feedback path to the other.

It is another object of the present invention to provide an oscillator which includes two feedback paths, one of which has a good transient response and means for transferring control to the path having good transient response as the oscillator is tuned to higher frequencies.

These and other objects of the invention will become more clearly apparent from the following description when taken in conjunction with the accompanying drawing.

Referring to the drawing.

Figure 1:
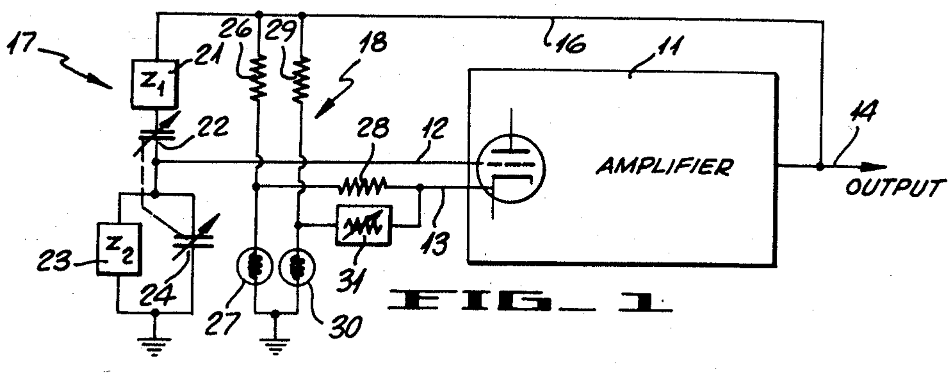
Figure 1 is a diagram showing an unbalanced oscillator in accordance with the invention.

Referring to Figure 1, an unbalanced oscillator is illustrated. The oscillator includes an amplifier 11 having input terminals 12 and 13, shown connected to the grid and cathode of the first stage of the amplifier, and an output terminal 14. A feedback path 16 is schematically illustrated and connects to the positive feedback frequency determining network designated generally by the reference numeral 17 and to the negative feedback amplitude limiting network designated generally by the reference numeral 18.

The frequency determining network may include a first branch having a serially connected impedance element 21 designated by $Z_1$ and a variable capacitor 22. The other branch of the frequency determining network includes the parallel combination of an impedance element 23 designated by $Z_2$ and a variable capacitor 24. Capacitors 22 and 24 are ganged and serve to determine the frequency of operation. The impedances 21 and 23 may be R-C networks which determine the range of operation and the frequency response characteristics. In certain instances, the elements 21 and 23 may be resistors in which instance the frequency of operation of the oscillator is given by $$f=\frac{1}{2\pi \text{ R-C}}$$

assuming that the capacitors 22 and 24 have equal values and that the resistors 21 and 23 have equal values. The common terminal of the series parallel positive feedback networks is connected to the input terminal 12.

The negative feedback circuits include a first circuit having a serially connected resistor 26 and a non-linear resistor 27 which may, for example, be incandescent lamp filament. The common terminal of the resistor 26 and lamp 27 is connected through a resistance element 28 to the other input terminal. A second negative feedback circuit includes serially connected resistor 29 and the filament of an incandescent lamp 30 having their common terminal connected through a photoresistor 31 to said other input terminal.

As previously described, the lowest frequency at which the oscillator may be operated is determined by the thermal time constant of the non-linear resistance element (lamp). As the oscillator is tuned to operate at lower and lower frequencies, a point is eventually reached where the lamp resistance tends to follow the individual variations of the A.-C. cycles. The effect of varying lamp resistance introduces distortions in the generated signal when the variations are small and causes both distortion and unstable operation as the variations become larger. In the negative feedback network of the present invention, non-linear elements 27 and 30 are so chosen that the non-linear element 30 is suitable for operation at substantially higher frequencies than the element 27 whereby the oscillator has good transient response. The network including the resistors 28 and photoresistor 29 serves to transfer control from the first negative feedback loop to the second whereby the oscillator is operated stably over a substantial range of frequencies. The transfer is achieved by increasing the illumination on the photoresistive element 31 as the oscillator is tuned to higher and higher frequencies. The network including resistor 28 and photoresistor 31 acts as a potentiometer and as the light increases on the element 31, its resistance decreases and the input terminal to the amplifier is connected almost directly to the second network at the higher frequencies.

Figure 3:
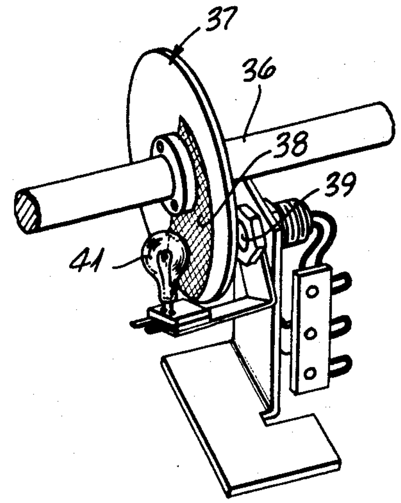
Figure 3 shows a suitable means for transferring control from one feedback path to another.

The variation of light may be achieved by means such as are illustrated in Figure 3. The tuning shaft 36 which serves to drive the tuning capacitors 22 and 24 also carries a transparent disk 37 which is coated by an opaque film 38 substantially as indicated. A photocell 39 is mounted on one side of the disk and a light bulb 41 on the other side. It is seen that as the tuning shaft is turned in a clockwise direction, more light will impinge upon the photoresistive element and thus its resistance will be reduced. Thus, if the shaft is connected for tuning the oscillator at higher and higher frequencies as the shaft is rotated clockwise, the apparatus will operate substantially as described above.

Figure 2:
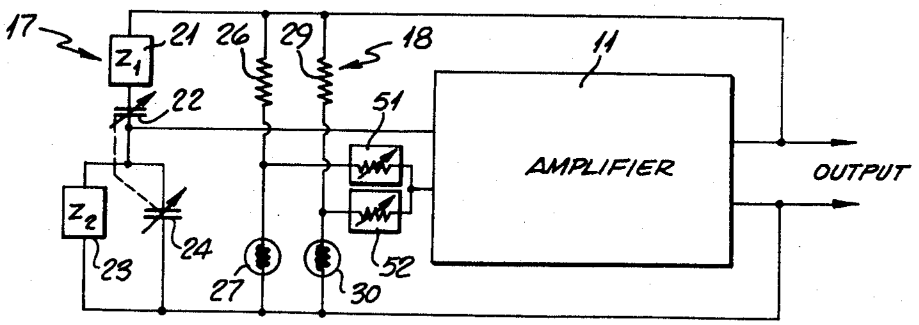
Figure 2 is a diagram showing a balanced oscillator in accordance with the invention.

Referring to Figure 2, a balanced circuit is illustrated, in which like reference numerals refer to like parts. In the embodiment of Figure 2, the resistive network which serves to connect the negative feedback loop to the input of the amplifier includes a pair of photoresistive elements 51 and 52. The light cam is so formed that as the illumination on one photoresistive element is increased, that on the other is reduced whereby the series resistance of the potentiometer remains substantially constant and yet transfers control from one negative feedback loop to the other.

Figure 4:
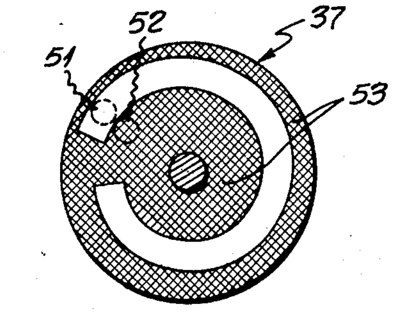
Figure 4 shows another means for transferring control from one feedback path to another.

For this purpose, a pair of lamps 41 are employed and the transparent disk 37 has an opaque cam of the type shown at 53 (Figure 4). The dotted circles 51 and 52 indicate the relative position of the photoconductors. Thus, as the shaft is rotated counterclockwise, the illumination on the element 51 decreases while that on the element 52 increases transferring control from the first to the second loop as previously described.

Thus it is seen that an oscillator which has improved transient response at the higher frequencies is provided. The oscillator includes a pair of negative feedback loops designed for different frequencies of operation and means for transferring control from one feedback loop to the other. The oscillator operates stably at substantially high frequencies and with relatively small distortion.

We claim:

1. An oscillator comprising an amplifier having input and output terminals, a positive feedback path including a frequency determining network connected between the output and input terminals, first and second separate and independent negative feedback paths including first and second non-linear resistive elements connected between the input and output and serving to limit the amplitude of oscillation, said second negative feedback path serving to operate at substantially higher frequencies than said first path, and means for transferring the control of negative feedback from the first path to the second as the frequency is increased.

2. An apparatus as in claim 1 wherein said means for transferring control from one feedback path to the other includes a potentiometric element including a photoconductor.

3. An apparatus as in claim 1 wherein said means for transferring control from the first to the second negative feedback path comprises a pair of serially connected photoconductors connected to act as a potentiometer, and means for simultaneously increasing the illumination on one of said photoconductors as the illumination on the other of said photoconductors is decreased whereby the overall resistance of the potentiometer remains substantially constant.

4. A wide band R-C oscillator comprising an amplifier having input and output terminals, a positive feedback path including a frequency determining network connected between the input and output and serving to determine the frequency of operation, a pair of negative feedback paths each including serially connected resistive elements and a non-linear resistance element, a potentiometer connected between said paths and having a terminal connected to the amplifier, said potentiometer including at least one photoresponsive resistance element, and means for varying the illumination on said photoresponsive element as the amplifier is tuned to thereby transfer control from one negative feedback circuit to the other.

References Cited in the file of this patent

UNITED STATES PATENTS 2,765,437 Cohen ---------------- Oct. 2, 1956